(12) United States Patent
Haraguchi

(10) Patent No.: US 7,280,380 B2
(45) Date of Patent: Oct. 9, 2007

(54) SEMICONDUCTOR MEMORY DEVICE AND METHOD OF MAKING DESIGN CHANGE TO SEMICONDUCTOR CHIP

(75) Inventor: Yoshinori Haraguchi, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 133 days.

(21) Appl. No.: 11/302,325

(22) Filed: Dec. 14, 2005

(65) Prior Publication Data

US 2006/0133123 A1      Jun. 22, 2006

(30) Foreign Application Priority Data

Dec. 16, 2004   (JP) ............... 2004-364410

(51) Int. Cl.
*G11C 5/02*      (2006.01)
(52) U.S. Cl. .......................... 365/51; 365/63
(58) Field of Classification Search ............ 365/51, 365/63, 189.05
See application file for complete search history.

(56) References Cited

U.S. PATENT DOCUMENTS

| 5,619,472 | A | 4/1997 | Okamura |
| 6,021,080 | A * | 2/2000 | Miyano ................. 365/226 |
| 6,727,533 | B2 * | 4/2004 | Matsuzaki et al. ........ 257/266 |
| 6,813,213 | B2 * | 11/2004 | Nagata et al. ......... 365/230.03 |

FOREIGN PATENT DOCUMENTS

| JP | 08-139287 | 5/1996 |
| JP | 2000-353785 | 12/2000 |
| JP | 2003-007860 | 1/2003 |

* cited by examiner

*Primary Examiner*—Anh Phung
(74) *Attorney, Agent, or Firm*—McDermott Will & Emery LLP

(57) ABSTRACT

The positions of the main driver 10, the output pad 20 and the first buffer 61 and the second buffer 62 are changed from the central region 111 to the peripheral region 120, and the first control signal line 31 and the second control signal line 32 are elongated. The distance between the output pad 20 and the main driver 10 is maintained so that the resistance between the output pad 20 and the main driver 10 does not increase.

11 Claims, 2 Drawing Sheets

SEMICONDUCTOR MEMORY DEVICE AND METHOD OF MAKING DESIGN CHANGE TO SEMICONDUCTOR CHIP

TECHNICAL FIELD OF THE INVENTION

The present invention relates in general to a semiconductor chip and a method of making design change to a semiconductor chip and more particularly to a semiconductor chip including a main region and a peripheral region which surrounds the main region.

Since a change of main specification to an SDRAM, a central pad structure of a DRAM has been a mainstream. JP-A-08-139287 discloses a DRAM chip in which input/output pads and output circuits are positioned at the center thereof. Regarding a recent DRAM chip as represented by an SDRAM chip, there has been a lot of intellectual property in accordance with the central pad structure. There have been needs for enhancing the value of the intellectual property of the center pad type chip.

SUMMARY OF THE INVENTION

In view of the foregoing considerations, the present invention is directed to a semiconductor chip, and to a corresponding method of making design change to a semiconductor chip.

An aspect of the invention provides a method of making design change to a semiconductor chip comprising a main driver, an output pad, a first control signal line, a second control signal line, a first predriver and a second predriver; wherein a main driver comprises an output node, a pMOSFET and an nMOSFET, the pMOSFET comprises a first gate for receiving a first control signal, the nMOSFET comprises a second gate for receiving a second control signal, the output pad is coupled to the output node, the first control signal line transmits the first control signal, the second control signal line transmits the second control signal, the first predriver drives the first control signal line, and the second predriver drives the second control signal line. The method comprises: preparing layouts of the semiconductor chip; and arranging the first control signal line physically next to and physically in parallel with the second control signal line.

DETAILED DESCRIPTION OF PREFERRED EMBODIMENT

Figure 1:
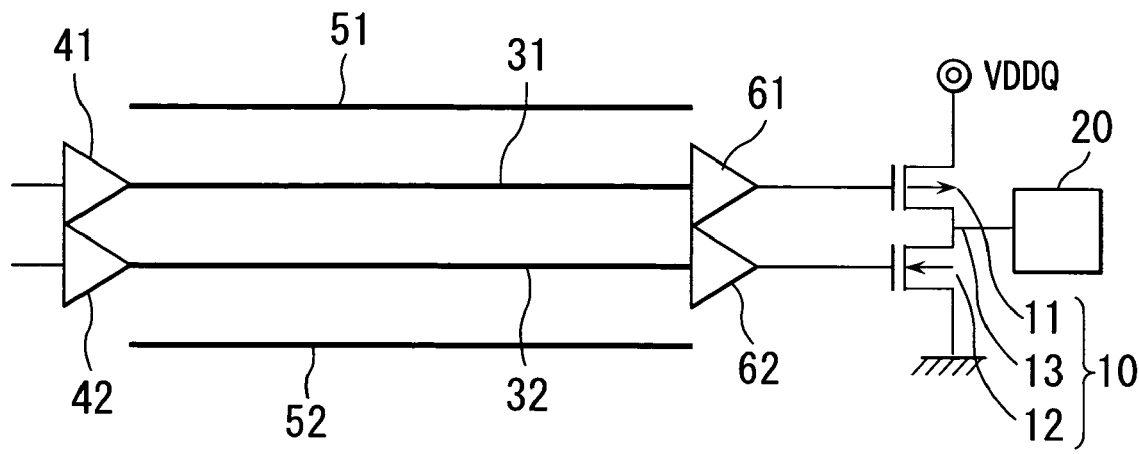
FIG. 1 shows a data output circuit of a semiconductor chip of one embodiment of the present invention.

In the following detailed description of a preferred embodiment according to the present invention, reference is made to the accompanying drawings that form a part hereof, and in which is shown, by way of illustration, specific embodiments in which the invention may be practiced. In the drawings like numerals describe substantially similar components throughout the several views. These embodiments are described in sufficient detail to enable those skilled in the art to practice the invention. Other embodiment may be utilized and structural, logical, and electrical changes may be made without departing from the scope of the present invention. The following detailed description is, therefore, not to be taken in a limiting sense, and the scope of the present invention is defined only by the appended claims and equivalents thereof.

An embodiment of the present invention relates to a DRAM chip and more particularly to a data output circuit thereof. The present invention not limited to DRAM chip but is applicable to another type of a semiconductor chip such as a semiconductor memory chip.

As shown in FIG. 1, the data output circuit of the present embodiment comprises a main driver 10, an output pad 20, a first control signal line 31, a second control signal line 32, a first predriver 41, a second predriver 42, a first ground line 51, a second ground line 52, a first buffer 61 and a second buffer 62.

The main driver 10 is a CMOS driver including a pMOSFET 11, an nMOSFET 12 and an output node 13. A voltage of VDDQ is applied to the main driver 10. The output pad 20 is coupled to the output node 13. The output pad 20 of this embodiment is a so-called I/O common pad and is also used as an input pad on data input period.

The first control signal line 31 is coupled to the gate of the pMOSFET 11 through the first buffer 61. The second control signal line 32 is coupled to the gate of the nMOSFET 12 through the second buffer 62. The first control signal line 31 is formed physically next to and physically in parallel with the second control signal line 32, wherein the term "next to" means "right next to", and "line A is arranged physically next to line B" means that there is no other signal/ground line between the lines A and B.

The first predriver 41 drives the first control signal line 31. The second predriver 42 drives the second control signal line 32.

The first ground line 51 is formed physically next to the first control signal line 31 and the first control signal line 31 is physically positioned between the first ground line 51 and the second control signal line 32. The second ground line 52 is formed physically next to the second control signal line 31. The second control signal line 32 is physically positioned between the first control signal line 31 and the second ground line 52. The DRAM chip 100 of this embodiment includes a plurality of output pads 20, or DQ pins, and pairs of the first control signal line 31 and the second control signal line 32. The first ground line 51 is positioned between one pair of the first control signal line 31 and the second control signal line 32 and another pair of the first control signal line 31 and the second control signal line 32 so that the one pair of the first control signal line 31 and the second control signal line 32 is shielded from the noise of the other pairs.

The first buffer 61 and the second buffer 62 of this embodiment are formed by a plurality of stages of inverters. In this embodiment, all of the inverters of the first buffer 61 and the second buffer 62 are coupled to the ends of the first control signal line 31 and the second control signal line 32.

Figure 2:
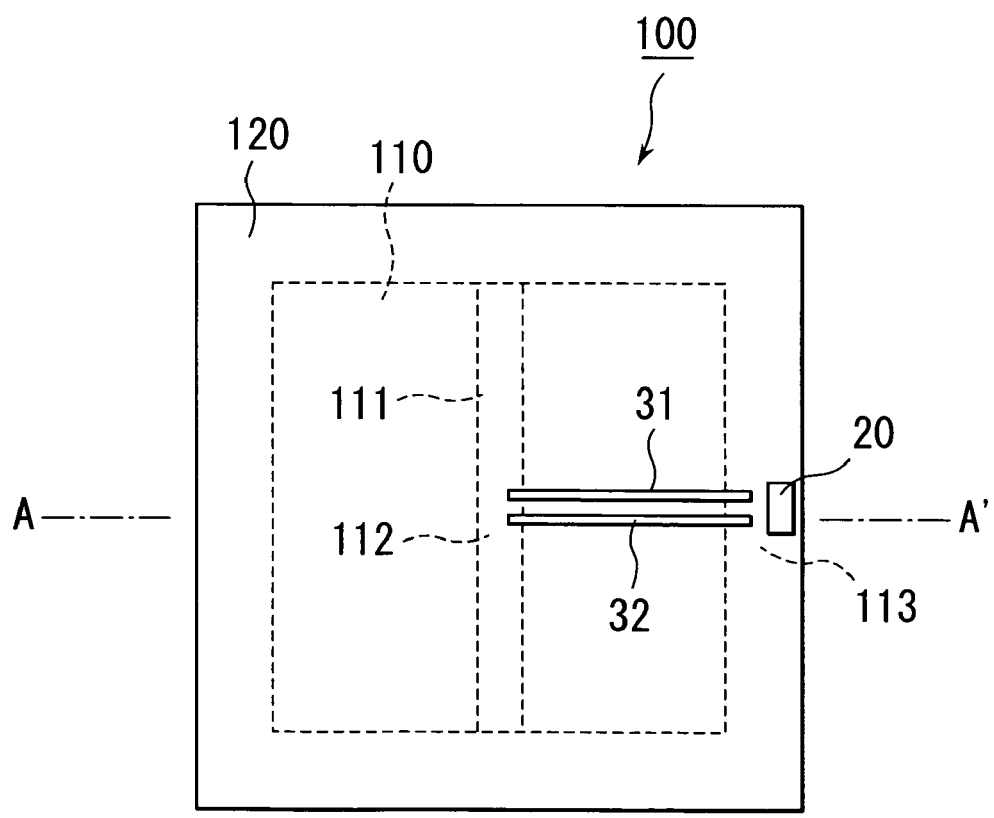
FIG. 2 shows a plan view of the semiconductor chip of one embodiment of the present invention.
Figure 3:
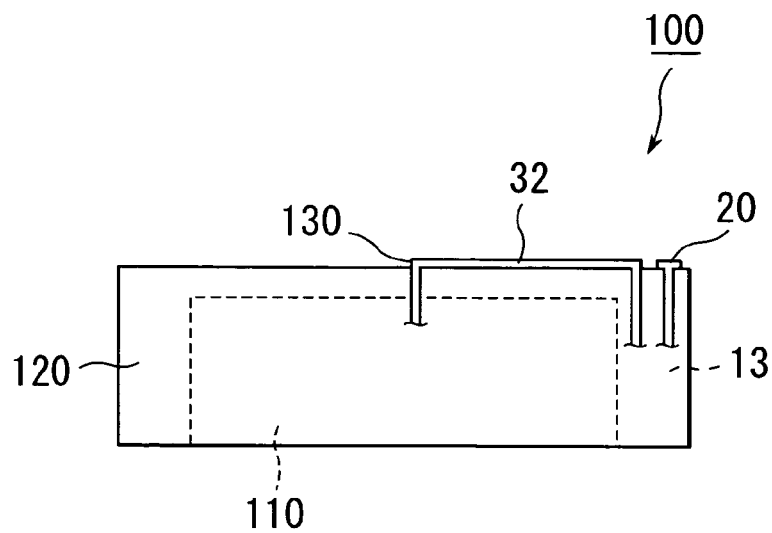
FIG. 3 shows a cross sectional view taken along lines A-A' of FIG. 2.

FIGS. 2 and 3 are the simplified illustrations of the DRAM chip 100 of this embodiment. In FIGS. 2 and 3, a layout of the first control signal line 31 and the second control signal line 32 are schematically illustrated. FIG. 2 is the plan view of the DRAM chip 100. FIG. 3 is the cross sectional view of the DRAM chip 100. In FIG. 3, hatch patterns are omitted so that the layout of the DRAM chip 100 is clearly seen.

As shown in FIGS. 2 and 3, the DRAM chip 100 includes a main region 110, a peripheral region 120 and an upper line layer 130. Memory array of the DRAM chip 100 is formed in the main region 110. As shown in FIG. 2, the peripheral region 120 surrounds the main region 110 in the plane where the memory array is formed. As shown in FIG. 3, in the vertical direction perpendicular to the memory array, the peripheral region 120 is stacked on the main region 110 and the upper line layer 130 is stacked on the peripheral region 120. The DRAM chip 100 includes several numbers of line layers, and the line layer 130 is the uppermost line layer among them.

As shown in FIG. 2, the main region 110 includes a central region 111. The central region 111 includes a region 112 where the first predriver 41 and the second predriver 42 are positioned. The peripheral region 120 includes a region 113 where the main driver 10 and the output pad 20 are positioned.

In this embodiment, each of the first control signal line 31 and the second control signal line 32 has first to third portions. The first portion extends in the vertical direction from the first or the second predriver 41, 41 to the upper line layer 130. The second portion is laid on the upper line layer 130 and extends from the region 112 to the region 113 over a part of memory array in the main region 110. The third portion extends in the vertical direction from the upper line layer 130 to the first or the 2nd buffer 61, 62. The second portion is made up of a majority of the first control signal line 31 and the second control signal line 32. The lengths of the second portions are far longer than a distance of the output node 13 and the output pad 20.

Figure 4:
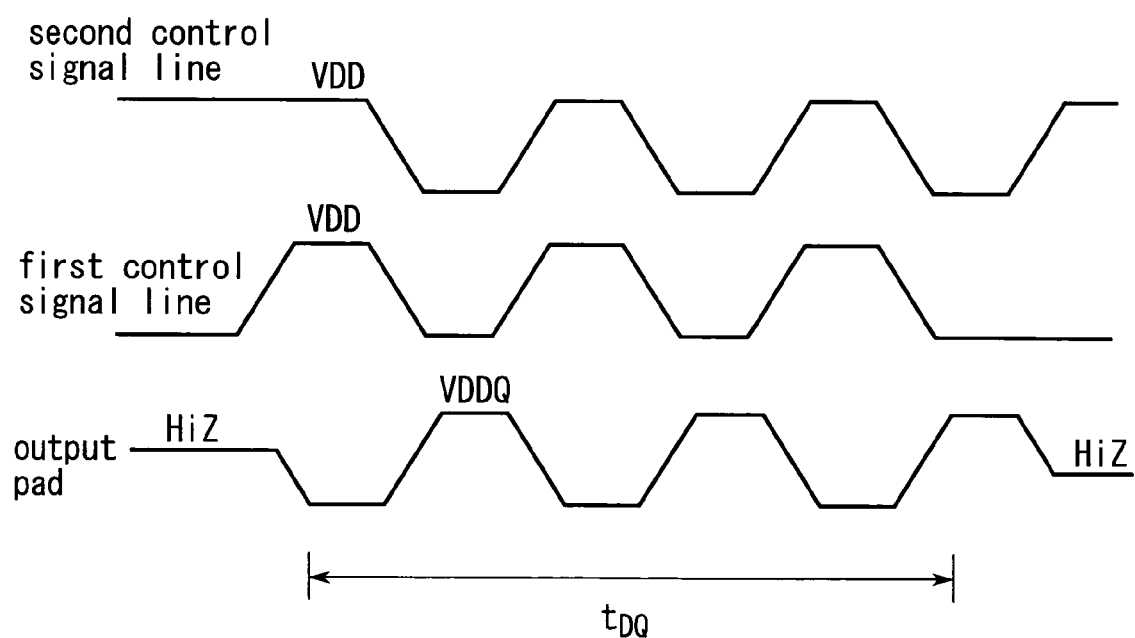
FIG. 4 shows a timing diagram of operation of the data output circuit of FIG. 1.

As shown in FIG. 2, the first control signal line 31 and the second control signal line 32 are formed in parallel. On a high impedance (HiZ) output period, opposite-phase signals are transmitted through the first control signal line 31 and the second control signal line 32. On the other hand, as shown in FIG. 4, on a data output period $t_{DQ}$ (at the time of low impedance (LowZ) output), in-phase signals of the first control signal and the second control signal are transmitted through the first control signal line 31 and the second control signal line 32, respectively. In other words, during the data output period $t_{DQ}$, the first control signal has the same signal waveform change as that of second control signal. The first control signal line 31 is formed physically next to and physically in parallel with the second control signal line 32 so that a capacitance therebetween is 0 upon the data output period $t_{DQ}$. Since the first control signal line 31 and the second control signal line 32 have the capacitance of 0, a voltage therein quickly changes as intended, and data can be transmitted through the first and the second control signal line 31, 32 with high speeds.

In one modification of the above mentioned embodiment, parts of the inverters of the first buffer 61 and the second buffer 62 may be positioned in the first control signal line 31 and the second control signal line 32, wherein the first buffer 61 and the second buffer 62 include the same number of the inverters which are so arranged that the first control signal line 31 and the second control signal line 32 transmit in-phase signals on the data output period $t_{DQ}$ in any part thereof.

Now, explanation will be made about a method of making design change to a semiconductor chip. The design change is applied to the change from a center pad type semiconductor chip to the edge type semiconductor chip, such as the DRAM chip 100 of this embodiment. The central pad type semiconductor chip has a main region 110 including a central region 111 which is similar to the DRAM chip 100 described above. The central pad type semiconductor chip has an output circuit positioned at the central region.

After preparing the layouts of the center pad type semiconductor, the layouts are so changed that a peripheral region 120 and a line layer 130 are added to the main region 100 of the center pad type semiconductor. The positions of the main driver 10, the output pad 20 and the first buffer 61 and the second buffer 62 are changed from the central region 111 to the peripheral region 120, and the first control signal line 31 and the second control signal line 32 are elongated to the first and the second buffers 61, 62. The distance between the output pad 20 and the main driver 10 is maintained so that the resistance between the output pad 20 and the main driver 10 does not increase. The first control signal line 31 and the second control signal line 32 are formed on the uppermost line layer 130 so that the layouts of the first control signal line 31 and the second control signal line 32 can be arranged flexibly.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A semiconductor chip, comprising:
   a main driver comprising a pMOSFET, an nMOSFET and an output node, wherein the pMOSFET has a first gate for receiving a first control signal and the nMOSFET has a second gate for receiving a second control signal;
   an output pad coupled to the output node;
   a first control signal line for transmitting the first control signal;
   a second control signal line for transmitting the second control signal;
   a first predriver for driving the first control signal line;
   a second predriver for driving the second control signal line;
   the first control signal line is arranged physically next to and physically in parallel with the second control signal line.

2. The semiconductor chip of claim 1, wherein;
   the first control signal line and the second control signal line are arranged so that the first control signal line and the second control signal line have a capacitance of zero therebetween when the first control signal has a value equal to that of the second control signal.

3. The semiconductor chip of claim 1, wherein
   each of the first control signal line and the second control signal line has a length longer than a distance between the output node and the output pad.

4. The semiconductor chip of claim 1, further comprising:
   a main region; and
   a peripheral region;
   wherein the output pad and the main driver are positioned on the peripheral region and the first predriver and the second predriver are positioned on the main region.

5. The semiconductor chip of claim 1, further comprising:
   a first ground line; and
   a second ground line;
   wherein the first control signal line is positioned between the first ground line and the second control signal line, the first ground line is physically next to the first control signal line, the second control signal line is positioned between the first control signal line and the second ground line, and the second ground line is physically next to the second control signal line.

6. The semiconductor chip of claim 1, further comprising:

a first buffer coupled between the first control signal line and the gate of the pMOSFET; and a second buffer coupled between the second control signal line and the gate of the nMOSFET.

7. The semiconductor chip of claim 1, further comprising a predetermined layer;

wherein the first control signal line and the second control signal line are formed on the predetermined layer.

8. The semiconductor chip of claim 7, further comprising a plurality of line layers, wherein the line layer is an uppermost line layer.

9. A semiconductor memory device comprising the semiconductor chip of claim 1.

10. The semiconductor memory device of claim 9, comprising a memory array, wherein the first control signal line and the second control signal line extend over the memory array.

11. A method of making design change to a semiconductor chip comprising a main driver, an output pad, a first control signal line, a second control signal line, a first predriver and a second predriver; wherein a main driver comprises an output node, a pMOSFET and an nMOSFET comprises a first gate for receiving a first control signal, the nMOSFET comprises a second gate for receiving a second control signal, the output pad is coupled to the output node, the first control signal line transmits the first control signal, the second control signal line transmits the second control signal, the first predriver drives the first control signal line, the second predriver drives the second control signal line, comprising:

preparing layouts of the semiconductor chip; and arranging the first control signal line physically next to and physically in parallel with the second control signal line.

* * * * *